United States Patent
Topaloglu et al.

(10) Patent No.: US 8,099,269 B2
(45) Date of Patent: Jan. 17, 2012

(54) TWO-STEP SIMULATION METHODOLOGY FOR AGING SIMULATIONS

(75) Inventors: Rasit O. Topaloglu, Santa Clara, CA (US); Jung-Suk Goo, Los Altos, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 677 days.

(21) Appl. No.: 11/869,522

(22) Filed: Oct. 9, 2007

(65) Prior Publication Data

US 2009/0094013 A1    Apr. 9, 2009

(51) Int. Cl.
*G06F 17/50*    (2006.01)
(52) U.S. Cl. ............................................. 703/14
(58) Field of Classification Search ............ 703/14, 703/19
See application file for complete search history.

(56) References Cited

U.S. PATENT DOCUMENTS

| | | | |
|---|---|---|---|
| 6,278,964 B1 * | 8/2001 | Fang et al. | 703/19 |
| 7,292,968 B2 * | 11/2007 | Wu et al. | 703/13 |
| 7,567,891 B1 * | 7/2009 | Liu et al. | 703/13 |

OTHER PUBLICATIONS

Marc et al., Improvement of Aging Simulation of Electronic Circuits Using Behavioral Modeling, Jun. 2006, IEEE Transactions on Device and Materials Reliability, vol. 6, No. 2, pp. 228-234.*
Bestory et al., Multi-level modeling of hot carrier injection for reliability simulation using VHDL-AMS, Sep. 2006, Enseirb—University of Bordeaux 1.*

* cited by examiner

*Primary Examiner* — Dwin M Craig
*Assistant Examiner* — Aniss Chad
(74) *Attorney, Agent, or Firm* — Ditthavong Mori & Steiner, P.C.

(57) ABSTRACT

The present invention is a method and system for simulating the aging process of a circuit. A two-step process is employed whereby, in a first simulation step, a simulation is conducted to obtain node voltages for the original circuit and the node voltages are stored in a file. In the second step, a subsequent simulation is run after transistors of the circuit are replaced by aging subcircuits, which contain aging models, and initial node voltages are updated. A script is used to set the bias voltage inputs for the aging models using the node voltages stored in the file from the first step. With more accurate bias voltage inputs for the aging models, the aging simulations are conducted to compute the circuit degradation.

17 Claims, 4 Drawing Sheets

TWO-STEP SIMULATION METHODOLOGY FOR AGING SIMULATIONS

FIELD OF THE DISCLOSURE

The disclosure relates to estimating aging, i.e. reliability, of a circuit, more particularly to simulation of a circuit with aging models that have adjusted bias parameters.

BACKGROUND

Reliability of electrical/electronic circuitry is crucial in many environments, such as, for example, medical devices, weapons systems, communications system, etc. Such systems and devices utilize various types of electronic circuits, including integrated circuits. As circuits age, they become less reliable until, at some point in time, performance becomes unacceptable. Thus it is important to estimate the effective life of a circuit during the initial circuit design to enable design optimization.

One aging defect, commonly known as Negative Bias Temperature Instability (NBTI), can be attributed to a shift of a threshold voltage of a circuit transistor element. Threshold voltages increase over time due to interface states and fixed charges in the gate oxide of a semiconductor. As the absolute value of the gate to source voltage (Vgs) increases, NBTI worsens; i.e., the threshold voltage increase is a function of NBTI. Higher Vdd results in higher operating Vgs voltages and elevated temperatures increase the NBTI effect. NBTI is an important concern that requires frequent monitoring.

Another aging defect is caused by the phenomenon known as Hot Carrier Injection (HCI), which relates to the change in mobility of electrons/holes, over time. An electron or a "hole" gaining sufficient energy to pass through a potential barrier becomes a "hot carrier," migrating to a different area of the device. For example, in a MOSFET device, an electron may be injected from the silicon substrate to the gate dielectric. The misplacement of the hot carrier degrades performance. As hot carrier injection increases with time, failure due to drain current reduction will eventually occur. As the drain to source voltage (Vds) increases, HCI worsens. Other aging factors are related to effects of temperature, and changes in channel length and gate oxide, for example. As temperature increases, both NBTI and HCI worsen.

Aging models have been created for use in simulation of designed circuits. In the simulation process for circuits that include, for example, JFETs, MESFETs, MOSFETs, and like elements, aging models with input bias values, for example, gate-to-source, Vgs, or drain-to-source, Vds voltages and the like are utilized. The bias voltages can be obtained through node voltages. Vgs can be computed as Vgs=Vg−Vs and Vds can be computed as Vds=Vd−Vs, where Vd and Vs are the node voltages at the drain and source of a transistor, respectively. The aging models also depend on an effective stress time that is a factor in estimating the effects of NBTI and HCI. Effective stress time is dependent on input switching activity, i.e., frequency, duty cycle, rise/fall time of signals at the gate of each transistor, and is a parameter in equations describing NBTI and HCI. One problem with conventional methods of simulation is that since each transistor in a circuit degrades differently, it is difficult to judge the overall age of the circuit when many transistors are involved.

A known simulation technique employs "SPICE" software. SPICE is a general-purpose circuit simulation program for nonlinear dc, nonlinear transient, and linear ac analysis. In SPICE simulations, bias voltages, such as Vgs and Vds voltages, are manually set using initial bias conditions. As the number of circuits increases, it becomes unwieldy, and infeasible for a designer to manually set the bias voltages for each circuit element. As an approach to alleviating these problems, bias value assumptions for the aging models have been made in lieu of individualized bias settings. For example, for transistor circuits, such solution assumes that Vgs=Vdd and Vds=Vdd for each transistor. However, the accuracy of the aging simulation model is significantly compromised since accurate bias voltages are not used.

The need thus exists for a more accurate and efficient aging simulation technique.

DISCLOSURE

The problems imposed by manually setting initial bias voltage conditions for the aging models, by compromising accuracy through "converged" voltages and by making assumptions such as Vgs=Vdd, are obviated. "Converged" voltages may result if aging subcircuits are inserted in a circuit netlist and the node voltages computed by a single step simulation are directly used in the aging models. Subcircuits may be thought of as subroutines of the SPICE software program. Each subcircuit may be given a file name and specify circuit nodes that will connect to the overall main circuit. In the present disclosure, a two-step simulation provides greater accuracy and more realistic results. Such a two-step approach provides a more accurate aging simulation that, in turn, provides a more accurate assessment when deciding whether to improve the existing technology or to improve the existing circuit design.

During the simulation process, initial bias conditions are set to nominal values. The Vds-HCI parameter is set to the initial Vdd solution. The Vgs-NBTI parameter is set to the initial Vgs voltage for each transistor individually. Using a Perl (Practical Extraction and Reporting Language) script, a known script programming language similar in syntax to C language, the bias conditions obtained are collected. The initial bias voltages are then used in aging models and the simulation checks are updated. The simulation is run in order to obtain the actual Vgs and Vdd bias voltages as aging model inputs for each and every transistor in the circuit. These more accurate bias voltage values for the aging models are then used as a model in a second simulation step after which circuit degradation may be calculated. That is, the subsequent simulation is performed using the results obtained in the first step.

BRIEF DESCRIPTION OF THE DRAWINGS

Various exemplary embodiments are illustrated by way of example, and not by way of limitation, in the figures of the accompanying drawings in which like reference numerals refer to similar elements and in which.

DETAILED DESCRIPTION

Figure 1:
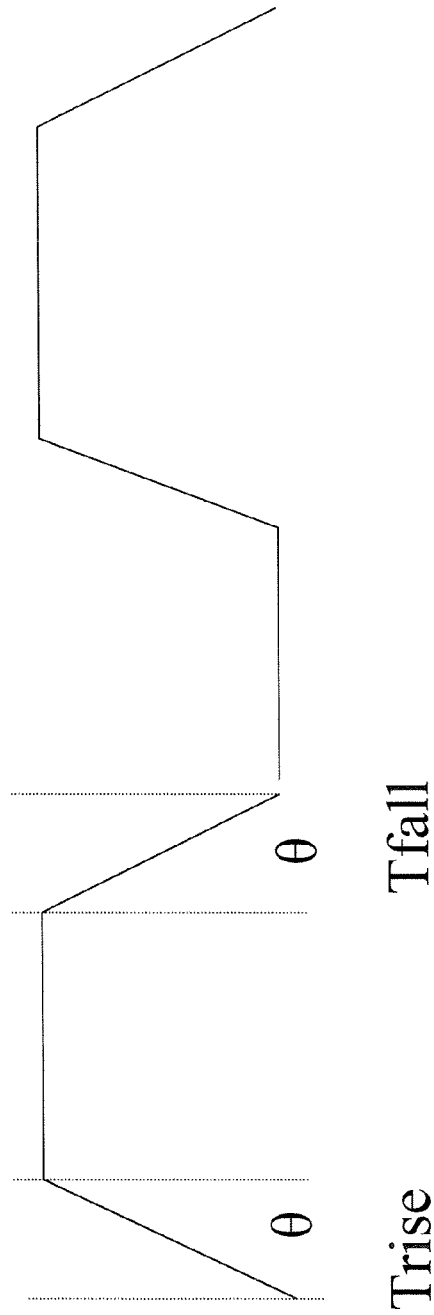
FIG. 1 is a waveform diagram for conventional effective stress time calculation.

FIG. 1 is a waveform indicative of the operation of a semiconductor device. Shown in the figure is a rise time, Trise, and a fall time, Tfall. Stress is greater in the device when operated in DC mode than when operated in AC mode. In AC mode, the device does recover some of the degradation lost due to stress. Aging, employing the HCI type of simulation, may be represented by:

$$\text{Age}_{HCI} = t_{operation} \cdot f(\text{Trise} + \text{Tfall}),$$

wherein aging employing HCI simulation is represented by the time a device is operational multiplied by the product of the frequency and the total of the rise time and the fall time. $\text{Age}_{HCI}$ is the effective stress time for HCI.

Aging, employing NBTI simulation, may be represented by:

$$\text{Age}_{NBTI} = t_{operation} \cdot \text{Duty Cycle},$$

wherein aging employing NBTI simulation is represented by the time a device is operational multiplied by the duty cycle of the waveform. $\text{Age}_{NBTI}$ is the effective stress time for NBTI. The duty cycle, as is known, is defined as the width of a pulse, or the amount of time the input signal is high in a period, divided by the period between pulses. Stated another way, duty cycle is the proportion of time during which a component, device, or system is operated. $t_{operation}$ is the time of operation, in years, of the device, and is internally converted to the effective stress time. Duty Cycle is a value between 0 and 1. HCI models can be turned off by setting frequency to a value of 0, while NBTI models can be turned off by setting Duty Cycle to a value of 0.

The useful life of a circuit component is related to the number and length of its activations. Higher duty cycle usage should thus lead to the shorter useful life expectancy. If a memory drive, for example, has a life expectancy of 1,000,000 hours based on a one percent duty cycle usage, the life expectancy would decrease to about 500,000 hours for duty cycle usage of two percent or increase to about 2,000,000 hours for duty cycle usage of 0.5 percent.

Figure 2:
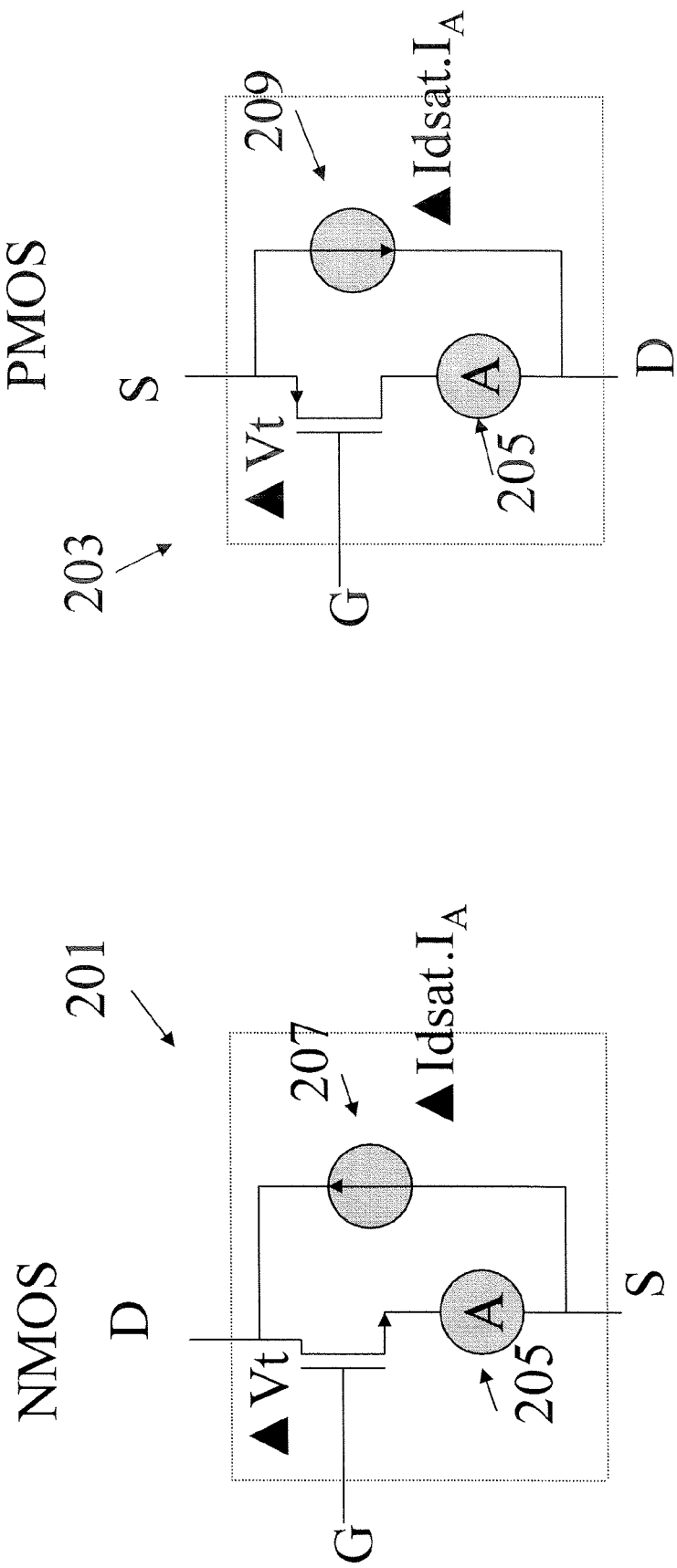
FIGS. 2A and 2B are NMOS and PMOS subcircuit diagrams, respectively, with aging reference characters.

FIG. 2A is a representation of an NMOS subcircuit, 201, used to implement the inventive aging models and FIG. 2B is a representation of a PMOS subcircuit, 203, used to implement the inventive aging models. The NMOS and PMOS devices shown are transistors having a gate G, source S, and drain D. An ammeter, 205, is shown at the source in both the NMOS device, and the PMOS device, for measuring the source current, 207, and drain current, 209, respectively. It should be noted, however, that the ammeter may just as well be located at the drain in each of these devices. Moreover, the drain or source currents may also be simulated in an initial simulation step. The ammeters 205 may also be implemented by simulating the drain or source currents in the initial simulation step. The node names and their corresponding voltage values are recorded in a computer memory location or a temporary file. These node voltage values are then used in a second step of the simulation process in order to compute Vgs and Vds of the aging models for transistors. ▲Vt represents the NBTI effect, and can be implemented using a parameter describing a threshold voltage shift, such as the delvto parameter in Hspice, which is a common circuit simulator. ▲Vt can alternatively be implemented using a voltage source at the gate terminal of a transistor. The ▲Vt value is defined by the NBTI aging models, which are a function of bias voltages and effective NBTI stress time amongst other process parameters. ▲Idsat represents the saturation current degradation effect for HCI. The current source, 207 or 209, shown functions as a current controlled current source, effectively reducing the drawn current. ▲Idsat can alternatively be implemented using a mobility multiplier parameter, such as mulu0 in Hspice. The ▲Idsat value is defined by the HCI aging models, which are a function of bias voltages and effective HCI stress time amongst other process parameters.

A preferred embodiment runs an initial simulation by using, for example, a conventional SPICE simulation technique. This may be performed, for example, by obtaining all the nodes voltages in a circuit. Other known circuit simulation tools such as, for example, HSPICE, PSPICE, and Spectre may also be used without departing from the invention described herein. These voltages are used in aging models to obtain degradation values. The degradation values are then used to perform a simulation with the computed voltages. Unlike the conventional NBTI and HCl methods of setting Vgs=Vdd and Vds=Vdd, resulting in inaccuracies by overestimating degradation, the present invention removes the inaccuracy by the using computed Vgs and Vds on each transistor in the circuit. All voltages values are saved in a file by associating a node name with a corresponding bias voltage. For a circuit, all of the node voltages are known. These node voltage values are then correlated to certain transistor nodes and node names. Thus, the voltage for each named node is known and stored in a file for future use.

Figure 3:
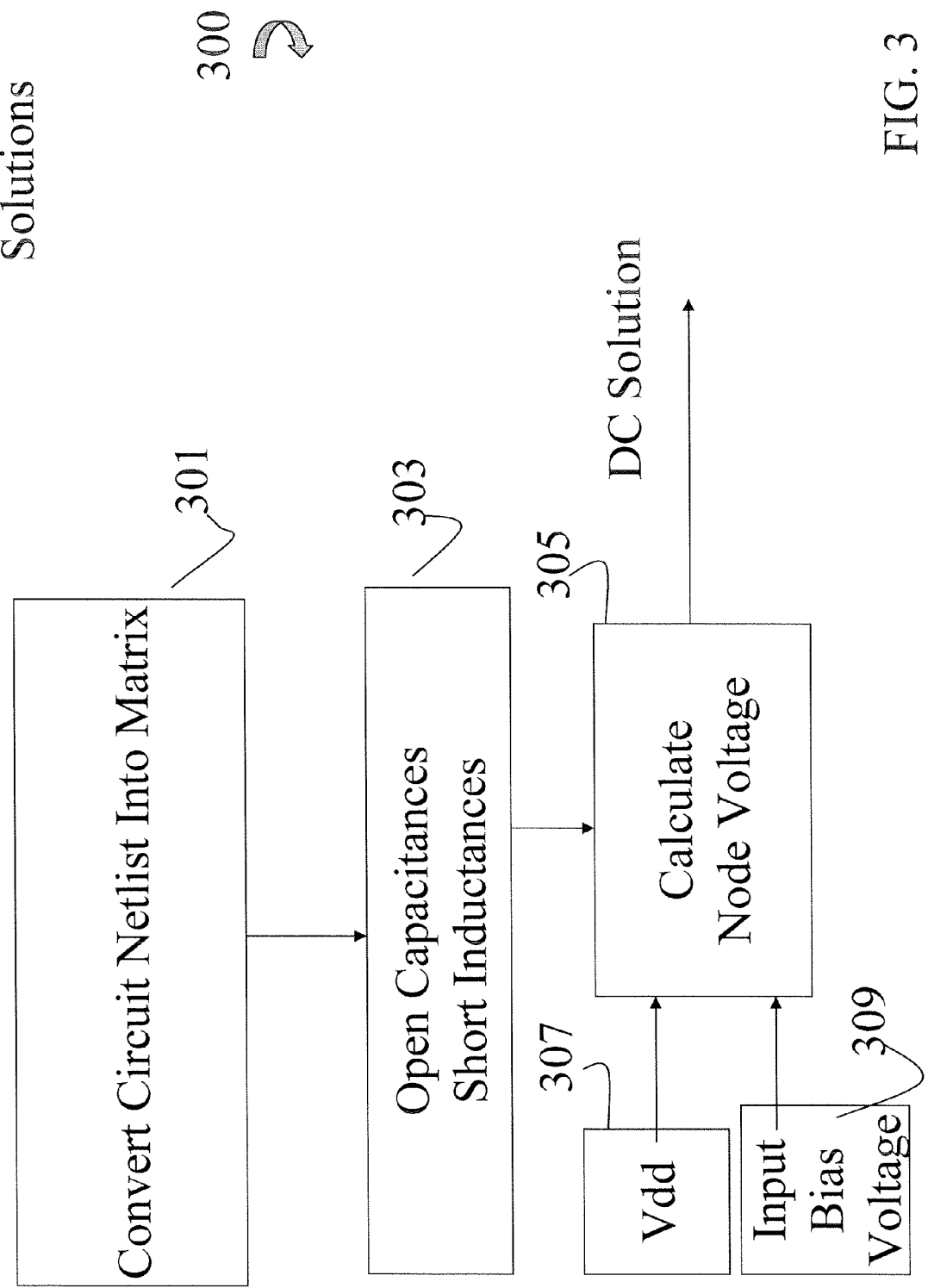
FIG. 3 is a flowchart depicting SPICE DC Solutions for calculating node voltages.

FIG. 3 is a flowchart, 300, depicting SPICE DC Solutions for calculating node voltages. A DC solution is the first step that a circuit simulator conducts before conducting other types of simulations such as AC and transient simulations. In fact, AC and transient simulations will employ the results obtained in the DC solution. In order to obtain a DC solution, the simulator first converts the circuit netlist into a matrix at 301. A circuit netlist may contain a list of logic gates and their interconnections which make up the circuit or a text file describing the circuit. A netlist is used as input to the simulator, which then uses the netlist and input stimulus files to imitate the function of the circuit design without having to incorporate the design in hardware. Simulating a circuit by providing netlists and stimulus data is an efficient and cost effective method of testing a circuit. The simulator then opens up capacitances and shorts inductances in the circuit, at 303. Then, with the circuit in this condition, i.e., capacitances shorted and inductances open, the node voltages are calculated, at 305, at each node, using Vdd, at 307, and input bias voltages, 309. The calculated node voltages result in what is known as the operating initial conditions, or the DC solution. The values in this DC solution are then stored in a file for use later in order to realize the two-step aging simulation of the present invention.

Figure 4:
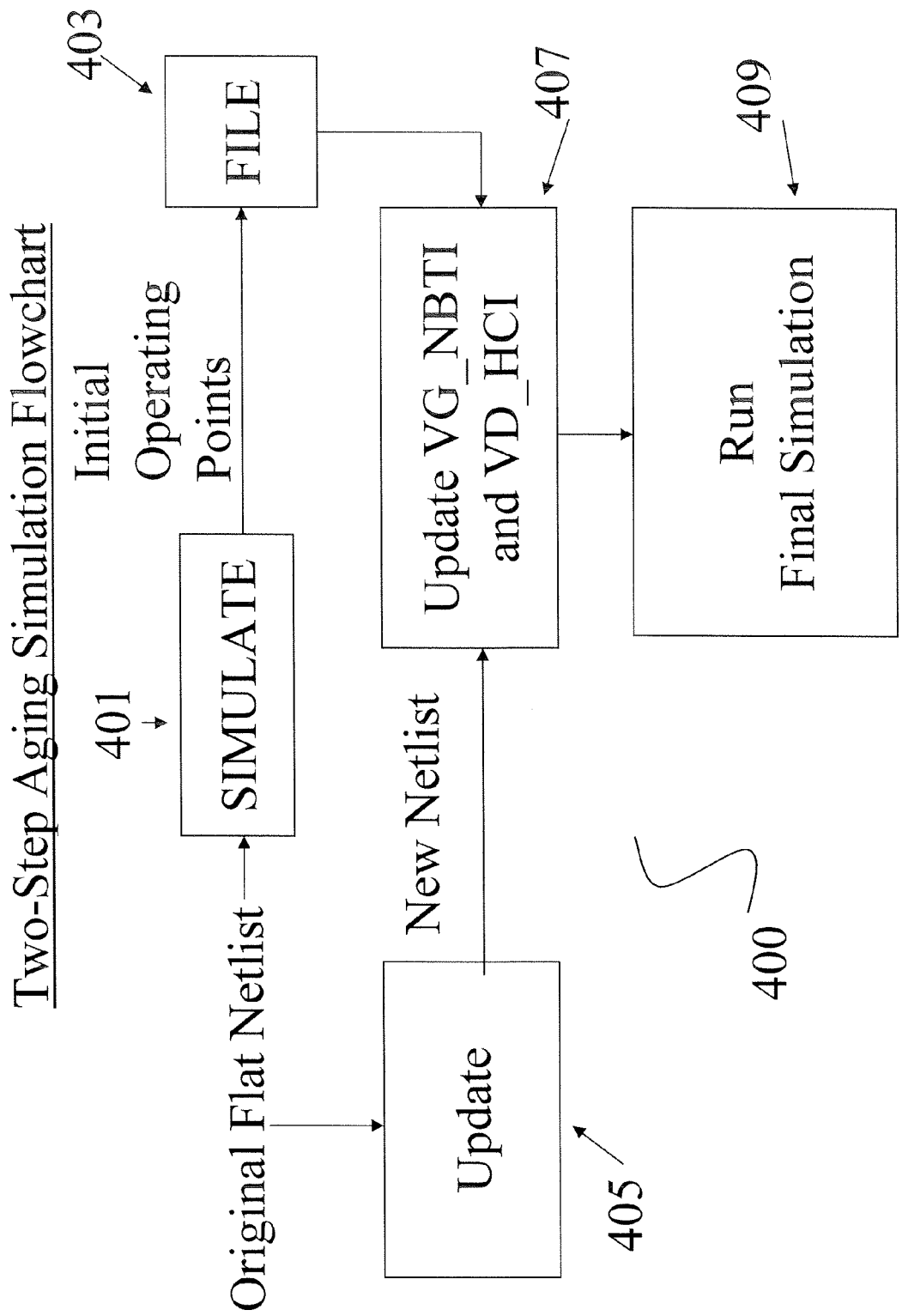
FIG. 4 is a flowchart depicting the two-step aging methodology in accordance with the present invention.

FIG. 4 is a flowchart, 400, describing the two-step simulation process. Using the original flat netlist, a first simulation is performed at step 401 in order to obtain initial operation points. These operation points, the DC solution, are then stored in a file, at step 403. This may be performed, for example, by a ".save" command in HSPICE. However, those skilled in the art will recognize that the operation points, or node names, and the node voltage values may also be stored in various places, such as, for example, the memory of a computer.

A "flat netlist" is a netlist representing the primitive elements of a circuit in a flattened, single level. The inventive method may also be applied to hierarchical netlists. Next, a script is used, e.g., a PERL script, for updating, at step 405, the original netlist in order to generate a new netlist. However, any appropriate script may be used, including, for example, programming languages such as C, C++, and scripting languages such as TCL. The updating is performed, for example, by replacing each transistor with a corresponding aging subcircuit and adding instance parameters, such as Vgs-NBTI, Vds-HCI, Duty Cycle, $t_{operation}$, and frequency. The Duty Cycle, $t_{operation}$, and frequency may be set the same way using global parameters, or they may be set differently for each transistor using an input file that maps the transistor names to corresponding Duty Cycle, $t_{operation}$, and frequency values. Then, Vgs-NBTI and Vds-HCI are updated, at step 407, using the DC operating initial condition file, at step 403, generated in the first step described with regard to FIG. 3. Finally, a second step of a final simulation is performed, at step 409, using the updated voltage values, to obtain the aging simulation results indicative of the estimated age of the simulated circuit.

In the preceding specification, various preferred embodiments have been described with reference to the accompanying drawings. It will, however, be evident that various modifications and changes may be made thereto, and additional embodiments may be implemented, without departing from the broader scope of the invention as set forth in the claims that follow. The specification and the drawings are accordingly to be regarded in an illustrative rather than restrictive sense.

What is claimed is:

1. A method of estimating aging of a circuit having a plurality of transistors, comprising:
    identifying initial bias parameters for the transistors of the circuit;
    simulating the circuit using the identified initial bias parameters;
    deriving modified bias parameters for the transistors of the circuit in accordance with the simulation;
    replacing the transistors with aging subcircuits, the aging subcircuits containing aging models;
    subsequently simulating the circuit by inputting the modified bias parameters into the aging models; and
    determining a result representative of the aging of the circuit in response to the subsequent simulation,
    wherein the steps of simulating comprise applying a SPICE circuit simulation and wherein the step of identifying comprises forming a netlist of circuit elements, the netlist containing nominal bias values for elements of the circuit, and modifying the netlist with the modified bias parameters prior to the subsequent simulation, the modified netlist being representative of the condition of the aging subcircuits.

2. The method of claim 1, wherein the step of deriving comprises adjusting the values of the bias parameters for an aging subcircuit of each transistor, respectively.

3. The method of claim 2, wherein the bias conditions comprise a gate to source bias voltage Vgs and a drain to source bias voltage Vds for each transistor in the circuit.

4. The method of claim 1, wherein the step of identifying comprises forming a netlist of circuit elements, the netlist containing nominal bias values.

5. The method of claim 4, wherein the netlist is formulated by applying a PERL script.

6. The method of claim 1, wherein the steps of simulating comprise applying one of an HSPICE, PSPICE, and Spectre circuit simulation.

7. The method of claim 1, wherein the subsequent simulation further comprises inputting effective stress time into the aging models.

8. A system for simulating the aging process of a circuit having a plurality of transistors, comprising:
    a netlist unit that contains bias values for parameters of the circuit;
    a simulator coupled to the netlist unit, the simulator configured to simulate the circuit using applied bias values;
    a processor coupled to the simulator; and
    means for modifying the bias values in accordance with an output of the simulator; wherein:
    the processor is configured to adjust initial bias values, to replace the transistors with aging subcircuits, the aging subcircuits containing aging models, to subsequently simulate the circuit by inputting the modified bias values into the aging models, to adjust the netlist unit bias values in response to an output of the subsequent simulation, and to generate a result representative of the aging of the electronic circuit in response to the simulation output produced from the adjusted values in the netlist unit,
    wherein the netlist is modified with the modified bias values prior to the subsequent simulation, the modified netlist being representative of the condition of the aging subcircuits.

9. The system of claim 8, wherein the parameters comprise a gate to source bias voltage Vgs and a drain to source bias voltage Vds for each transistor in the circuit.

10. The system of claim 9, wherein Vgs and Vds are adjusted for each transistor in the electronic circuit, respectively.

11. The system of claim 8, wherein the bias values are modified by a SPICE circuit simulation.

12. The system of claim 8, wherein the bias values are modified by one of an HSPICE, PSPICE, and Spectre circuit simulation.

13. The system of claim 8, wherein initial bias values are collected with a scripting or programming language.

14. The system of claim 13, wherein the scripting language is one of TCL and PERL.

15. The system of claim 13, wherein the programming language is one of C and C++.

16. The system of claim 8, wherein the subsequent simulation comprises inputting effective stress time into the aging models.

17. A method of simulating the aging process of an electronic circuit having a plurality of electronic components, comprising:
    a first simulation step for obtaining nominal parameters regarding the electronic components,
    wherein the nominal parameters are included in a netlist of the circuit components;
    replacing the electronic components with aging subcircuits comprising aging models;
    applying as input to the aging models, modified parameters obtained from the first simulation step;
    modifying the netlist with the modified parameters, the modified netlist being representative of the condition of the aging subcircuits;
    subsequently simulating the circuit using the modified parameters; and
    determining a result representative of the aging of the circuit in response to the subsequent simulation.

* * * * *